(12) United States Patent
Grosso et al.

(10) Patent No.: US 10,910,961 B2
(45) Date of Patent: Feb. 2, 2021

(54) SYSTEM USING A PIEZOELECTRIC GENERATOR TO PRODUCE ELECTRICAL POWER

(71) Applicant: PYTHEAS TECHNOLOGY, Meyreuil (FR)

(72) Inventors: Gilles Grosso, Six-Fours-les-Plages (FR); Frederic Mosca, Chateau-Neuf-le-Rouge (FR)

(73) Assignee: PYTHEAS TECHNOLOGY, Meyreuil (FR)

( * ) Notice: Subject to any disclaimer, the term of this patent is extended or adjusted under 35 U.S.C. 154(b) by 469 days.

(21) Appl. No.: 15/758,900

(22) PCT Filed: Sep. 23, 2016

(86) PCT No.: PCT/FR2016/052416
§ 371 (c)(1),
(2) Date: Mar. 9, 2018

(87) PCT Pub. No.: WO2017/051133
PCT Pub. Date: Mar. 30, 2017

(65) Prior Publication Data
US 2018/0254719 A1    Sep. 6, 2018

(30) Foreign Application Priority Data

Sep. 25, 2015   (FR) ...................... 15 59054

(51) Int. Cl.
*H02N 2/18*       (2006.01)
*H01L 41/113*     (2006.01)

(52) U.S. Cl.
CPC ............... *H02N 2/183* (2013.01); *H02N 2/18* (2013.01); *H02N 2/181* (2013.01); *H01L 41/113* (2013.01)

(58) Field of Classification Search
CPC .......... H02N 2/18; H02N 2/181; H02N 2/183; H01L 41/113
See application file for complete search history.

(56) References Cited

U.S. PATENT DOCUMENTS 5,660,106 A * 8/1997 Pitz ........................ B41K 3/123
                                                          101/110
7,005,779 B2   2/2006 Erickson
(Continued)

FOREIGN PATENT DOCUMENTS

DE    24 45 837 B1    10/1975
GB    2 106 330 A     4/1983

OTHER PUBLICATIONS

Written Opinion of the International Search Authority dated Jan. 18, 2017 of corresponding International application No. PCT/FR2016/052416; 4 pgs.

(Continued)

*Primary Examiner* — Emily P Pham
(74) *Attorney, Agent, or Firm* — Maier & Maier, PLLC

(57) ABSTRACT

An electrical power production system including a plurality of generator assemblies having: at least one piezoelectric generator for generating electrical power in response to a mechanical force applied onto said first generator, an actuator for applying a mechanical force onto the generator when said actuator is biased, a rotatable cam having a cam surface, a follower means for following the cam surface, a lever connected to the follower means, said lever being mounted as a lever arm and engaging with the actuator so as to bias said actuator when the cam is rotated and the cam surface exerts a mechanical force on the follower means, a rotatable wheel rotated by a power source and coupled to the cams so that setting said rotatable wheel in rotation at a rotation (Continued)

speed causes the rotation of said cams at another rotation speed, which is greater than that of said rotatable wheel.

13 Claims, 11 Drawing Sheets

(56) References Cited

U.S. PATENT DOCUMENTS

| | | | |
|---|---|---|---|
| 8,118,392 B2* | 2/2012 | Groenenboom | B41J 13/223 |
| | | | 347/22 |
| 10,505,471 B2* | 12/2019 | Emami | H02N 2/183 |
| 2004/0040779 A1* | 3/2004 | Bishop | B62D 3/12 |
| | | | 180/443 |
| 2005/0269907 A1 | 12/2005 | Erickson | |
| 2008/0007141 A1 | 1/2008 | Deck | |
| 2012/0119624 A1* | 5/2012 | Vamvas | H02N 2/18 |
| | | | 310/339 |
| 2013/0227832 A1* | 9/2013 | Doo | B21J 15/36 |
| | | | 29/525.01 |
| 2014/0252918 A1 | 9/2014 | Kameda et al. | |

OTHER PUBLICATIONS

International Search Report dated Jan. 18, 2017 of corresponding International application No. PCT/FR2016/052416; 4 pgs.

\* cited by examiner

SYSTEM USING A PIEZOELECTRIC GENERATOR TO PRODUCE ELECTRICAL POWER

FIELD

The invention has for object a system using a piezoelectric generator to produce electrical power. It also has for object a device and a method for applying a mechanical force on a piezoelectric generator in order to generate electrical power.

It relates to the technical field of piezoelectric generators able to produce electrical power when they are subjected to a mechanical stress.

BACKGROUND

Patent document U.S. Pat. No. 7,005,779 (ERICKSON) discloses a piezoelectric system that makes it possible to produce electrical power. In reference to the embodiment shown in FIG. 1 (corresponding to FIG. 3 of the ERICKSON document), this system comprises a generator assembly comprising:
  a piezoelectric generator 47 suitable for generating electrical power in response to a mechanical force applied onto said generator,
  a spring 46, playing the role of an actuator, which applies a mechanical force on the generator 47 when said spring is biased,
  a rotatable cam 40 having a cam surface,
  a follower roller 42 for following the cam surface,
  a lever 43 connected to the follower roller, said lever is mounted as a lever arm and engages with the spring 45 so as to bias said actuator when the cam 40 is rotated and the cam surface exerts a mechanical force on the roller 42.

The axis 41 of the cam 40 is directly coupled to a power source 12 which can be for example a wave turbine, a water turbine or a wind turbine, and which directly causes said cam to rotate.

This ERICKSON system does not perform well because the quantity of electrical power that it can generate is relatively low.

The invention aims to overcome this state of things. In particular, an objective of the invention is to significantly increase the quantity of electrical power that is able to be generated by a system of the type described hereinabove.

Another objective of the invention is to propose a generator system that is robust, of simple design and reliable.

Yet another objective of the invention is to propose an effective technique for applying a mechanical force on a piezoelectric generator in order to generate electrical power in substantial quantities.

SUMMARY

The solution proposed by the invention is a system for producing electrical power comprising at least one first generator assembly comprising:
  a first piezoelectric generator suitable for generating electrical power in response to a mechanical force applied onto said first generator,
  a first actuator suitable for applying a mechanical force onto the first generator when said first actuator is biased,
  a first rotatable cam having a cam surface,
  a first follower means for following the cam surface,
  a first lever connected to the first follower means, said first lever is mounted as a lever arm and engages with the first actuator so as to bias said actuator when the first cam is rotated and the cam surface exerts a mechanical force on the first follower means.

This system comprises the following remarkable characteristics:
  it comprises at least one second generator assembly comprising:
    a second piezoelectric generator suitable for generating electrical power in response to a mechanical force applied onto said second generator,
    a second actuator suitable for applying a mechanical force onto the second generator when said second actuator is biased,
    a second rotatable cam having a cam surface,
    a second follower means for following the cam surface,
    a second lever connected to the second follower means, said second lever is mounted as a lever arm and engages with the second actuator so as to bias said actuator when the second cam is rotated and the cam surface exerts a mechanical force on the second follower means,
  a rotatable wheel is rotated by a power source, said rotatable wheel is coupled to the first cam and to the second cam so that the setting of said rotatable wheel in rotation at a rotation speed causes the rotation of said cams at another rotation speed which is greater than that of said rotatable wheel.

In this particular design based on the principle of an epicyclic gearing, the cams play the role of satellites and the rotatable wheel that of the sun gear. A single rotatable wheel now makes it possible to set into rotation several cams and therefore to simultaneously stress several piezoelectric generators, which has for effect to multiply the quantity of electrical power produced.

Furthermore, as the rotation speed of the cams is greater than that of the rotatable wheel, this results that the excitation frequency of the piezoelectric generators is greater than the excitation frequency of said rotatable wheel by the power source. This configuration is particularly advantageous in the case where the power source is in the form of a primary collector of power from a wave turbine, water turbine, or wind turbine, directly engaged with the axis of the rotatable wheel. The invention then makes it possible to multiply the frequency of a wave or the rotation frequency of the blades of a water turbine or of a wind turbine, in order to further excite the piezoelectric generators and produce even more electrical power.

Generally, the power produced for a given rotation speed is determined by its geometry as well as by the piezoelectric properties of the materials used. The invention makes it possible to substantially increase its output, very simply, by amplifying the primary excitation frequency thereof, namely the excitation of the rotatable wheel by the source of power.

Other advantageous characteristics of the invention are listed hereinbelow. Each one of these characteristics can be considered individually or combined with the remarkable characteristics defined hereinabove, and can be the object, where applicable, of one or several divisional patent applications:

The system can comprise an integer N≥2 of generator assemblies (EGi) with each one comprising: —at least one piezoelectric generator suitable for generating electrical power in response to a mechanical force applied onto said generator; —an actuator suitable for applying a mechanical force onto the generator when said actuator is biased; —a rotatable cam having a cam surface; —a follower means for following the cam surface; —a lever connected to the follower means, said lever is mounted as a lever arm and engages with the actuator so as to bias said actuator when the cam is rotated and the cam surface exerts a mechanical force on said follower means. The rotatable wheel is coupled to the N cams so that the setting of said rotatable wheel in rotation at a rotation speed causes the rotation of the N cams at another rotation speed which is greater than that of said rotatable wheel.

The N cams are advantageously angularly offset with respect to the axis of rotation of the rotatable wheel, with this angular offset being 2p/N.

Each generator assembly is advantageously associated with a rotatable cam having a cam surface, with each said generator assembly comprising: —a first subassembly comprising: a piezoelectric generator, an actuator, a follower means for following the cam surface, a lever; —a second subassembly comprising: another piezoelectric generator, another actuator, another follower means for following the cam surface, another lever; the first subassembly and the second subassembly being arranged symmetrically with respect to the axis of rotation of the cam.

The cam surface is advantageously symmetrical with respect to the axis of rotation of the cam in such a way that the follower means for following the cam of the first subassembly and the follower means for following the cam of the second subassembly, have analogous and synchronised movements.

Each piezoelectric generator advantageously has the form of two piezoelectric pillars each formed by the alternation of piezoelectric ceramics and of electrodes stacked axially, with the two piezoelectric pillars being coaxial and arranged in opposition to one another.

The actuator advantageously has the form of a jaw arranged to simultaneously act on each one of the piezoelectric pillars when it is biased by the lever.

Advantageously, the system comprises an integer $M \geq 2$ of generator assemblies with each one comprising: —at least one piezoelectric generator suitable for generating electrical power in response to a mechanical force applied onto said generator; —an actuator suitable for applying a mechanical force onto the generator when said actuator is biased; —a rotatable cam having a cam surface; —a follower means for following the cam surface; —a lever connected to the follower means, said lever is mounted as a lever arm and engages with the actuator so as to bias said actuator when the cam is rotated and the cam surface exerts a mechanical force on said follower means; the M cams are mounted in parallel on a common rotating shaft, the rotatable wheel being engaged with this common axis of rotation in such a way that the setting into rotation of said common axis of rotation causes the simultaneous setting into rotation of said M cams.

Advantageously, the M cams have the same cam surface, said cam surface is comprised of a regular alternation of hollows and bumps; and the M cams are angularly offset on the common axis of rotation, with this angular offset being 2p/(M.B), where B corresponds to the number of bumps present on the cam surface of each one of said cams.

In an alternative embodiment, the M cams have the same cam surface, said cam surface is comprised of a regular alternation of hollows and bumps; and the follower means for following the cam surface of each generator assembly are angularly offset on the common axis of rotation, with this angular offset being 2p/(M.B), where B corresponds to the number of bumps present on the cam surface of each one of said cams.

The follower means advantageously comprises: —a rod suitable for exerting a mechanical force on the lever to which it is connected, said lever, in response, biases the corresponding actuator; —a roller, integral with the rod, mounted rolling on the cam surface, said roller is arranged in such a way that when the cam is rotated and said cam surface exerts a mechanical force on said roller, the mechanical force exerted by said rod on said lever is multiplied.

Another aspect of the invention relates to a device for applying a mechanical force on a piezoelectric generator in order to generate electrical power, said device comprises:

an actuator suitable for applying a mechanical force onto the generator when said actuator is biased, a rotatable cam having a cam surface, a follower means for following the cam surface, a lever connected to the follower means, said lever is mounted as a lever arm and engages with the actuator so as to bias said actuator when the cam is rotated and the cam surface exerts a mechanical force on said follower means.

This device is remarkable in that a rotatable wheel is suitable for being driven in rotation by a power source, said rotatable wheel is coupled with the cam, so that the setting of said rotatable wheel in rotation at a rotation speed drives the rotation of said cam at another rotation speed which is greater than that of said rotatable wheel.

Yet another aspect of the invention relates to a method for applying a mechanical force on a piezoelectric generator in order to generate electrical power, said method comprising the steps consisting in:

installing an actuator suitable for applying a mechanical force onto the generator (when said actuator is biased, installing a rotatable cam having a cam surface, installing a follower means for following the cam surface, mounting a lever as a lever arm, connecting the lever to the follower means, and having said lever engage with the actuator in such a way that said lever is able to bias said actuator and that in response to this biasing, said actuator applies a mechanical force onto the generator, driving the cam in rotation in such a way that the cam surface exerts a mechanical force on the follower means and the lever biases the actuator.

This method is remarkable in that it comprises a step consisting in coupling the cam with a rotatable wheel, so that the setting of said rotatable wheel in rotation at a rotation speed drives the rotation of said cam at another rotation speed which is greater than that of said rotatable wheel.

BRIEF DESCRIPTION OF THE FIGURES

Other advantages and characteristics of the invention shall appear better when reading the following description of a preferred embodiment, in reference to the attached drawings, provided as non-limiting examples for the purpose of information and wherein.

DETAILED DESCRIPTION OF THE FIGURES

Figure 2:
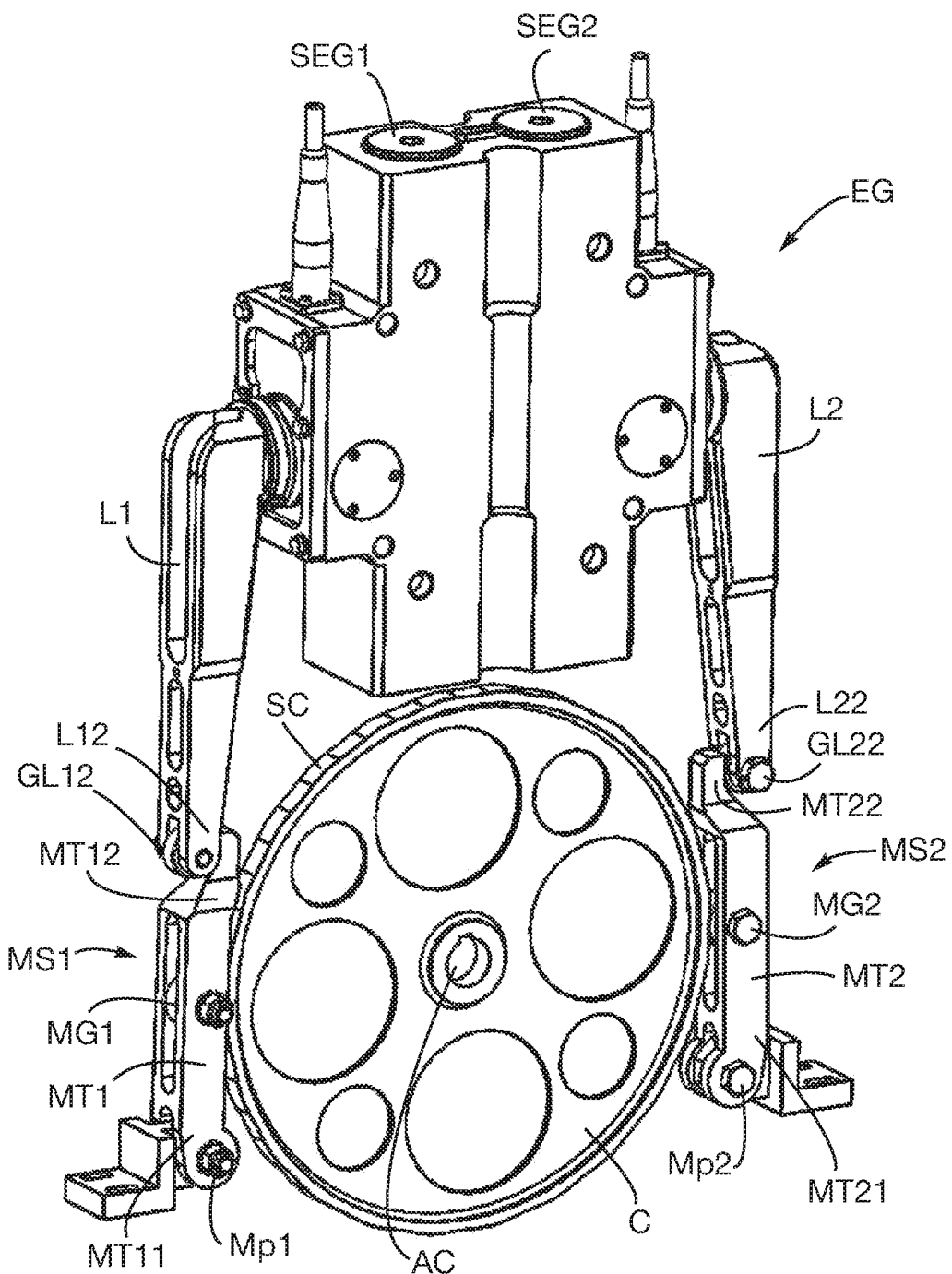
FIG. 2 is an isometric view of a generator assembly in accordance with the invention.
Figure 3:
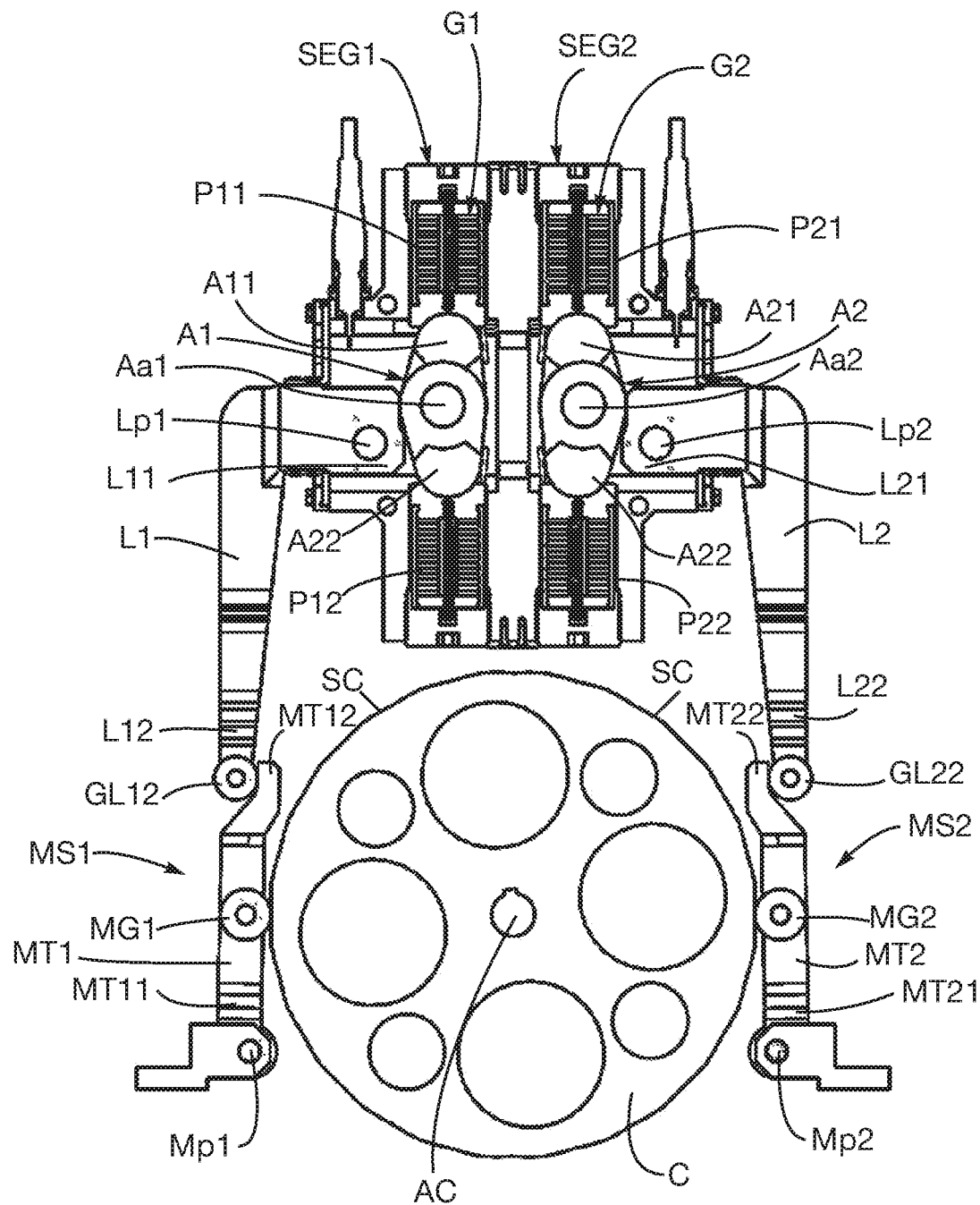
FIG. 3 is a view as a longitudinal cross-section of the generator assembly of FIG. 2.

FIGS. 2 and 3 show a generator assembly EG suitable for implementing the invention. This generator assembly EG is associated with a rotatable cam C having a cam surface SG.

The cam C is rotatably mounted about its axis of symmetry Ac. The cam C has for example the form of a metal disc of which the diameter is between 0.5 cm and 300 cm, preferably 40 cm and its thickness between 2 mm and 100 mm.

In FIGS. 2 and 3, the cam surface SC is corrugated. It is comprised of a regular alternation of hollows and bumps evenly distributed over the entire periphery of the cam C. The amplitude of the hollows and of the bumps is for example between 1 mm and 50 mm, preferably 2 mm. The cam surface SC advantageously has a sinusoidal profile. The distribution of the hollows and of the bumps is perfectly symmetric in such a way that two bumps or two hollows are located at the ends of the same diameter of the cam C.

The generator assembly EG shown in FIGS. 2 and 3 comprises two generator subassemblies SEG1, SEG2.

The first subassembly SEG1 comprising a piezoelectric generator G1, an actuator A1, a follower means MS1 for following the cam surface SC and a lever L1. The second subassembly SEG2 is similar to the first and also comprises a piezoelectric generator G2, an actuator A2, a follower means MS2 for following the cam surface SC and a lever L2.

Each piezoelectric generator G1, G2 preferably has the form of two piezoelectric pillars respectively P11, P12 and P21, P22 each formed by the alternation of piezoelectric ceramics and of electrodes stacked axially, with the two piezoelectric pillars, respectively P11-P12 and P21-P22, being coaxial and arranged in opposition to one another.

Figure 4:
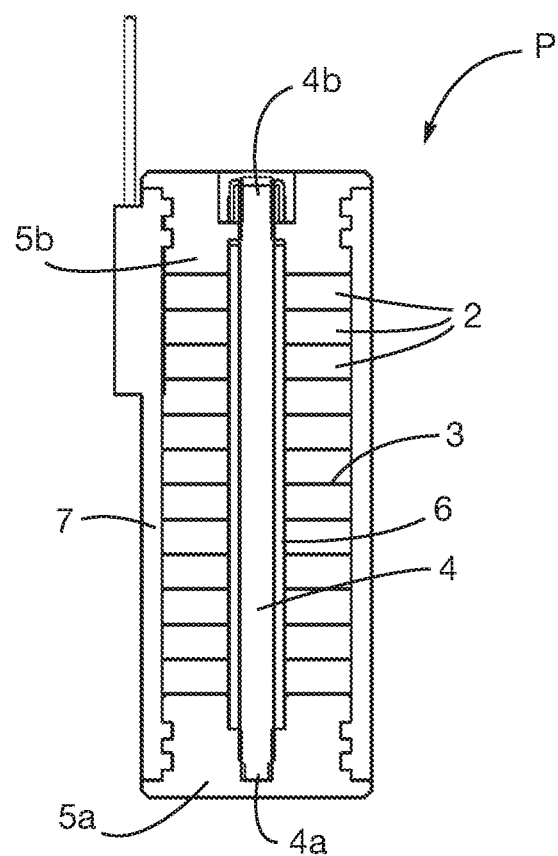
FIG. 4 is a diagrammatical view, as a cross-section, of a piezoelectric pillar used in a piezoelectric generator in accordance with the invention.

The pillars P11, P12 and P21, P22 are identical. FIG. 4 shows one of these pillars, said pillar bears the reference P. It is comprised of a stack of piezoelectric ceramics 2 alternated with electrodes 3 made from a conductive material, such as for example copper or bronze. The electrodes are wired in parallel or in series. The number of ceramics 2 and electrodes 3 varies from 2 to 50, even 150. These ceramics 2 and electrodes 3 have the same shape and preferably have a circular section. They are drilled axially. By way of example, their outer diameter is between 0.5 cm and 20 cm, and their thickness between 1 mm and 100 mm. The axial drilling diameter is for example between 0.5 cm and 10 cm. The axial drillings provide an axial alignment of the ceramics 2 and of the electrodes 3.

When the ceramics 2 and the electrodes 3 are stacked, the axial drillings delimit a central bore coaxial to the axis of the pillar P. This central bore allows for the passage of a rod 4 which ensures the centring, the alignment and participates in maintaining the ceramics 2 and electrodes 3. Means for fastening 5a, 5b are arranged at the ends 4a, 4b of the rod 4. These means for fastening 5a, 5b have for example the form of rigid parts fixed to the ends 4a, 4b of the rod 4 in such a way as to surround the stack of ceramics 2 and of electrodes 3. The part 5a has for example the form of a nut screwed to the threaded end 4a of the rod 4. The part 5b can also be a nut, or a tapped part, fastened to a chassis, and wherein the other threaded end 4b of the rod 4 is screwed.

For safety reasons, the stack of ceramics 2 and of electrodes 3 is advantageously insulated electrically. To do this, the rod 4 can be placed in a sheath or jacket 6 manufactured from an electrically insulating material such as plastic. It can also be provided to house the stack in a outer sheath or in a jacket 7 also manufactured from an electrically insulating material.

Figure 5:
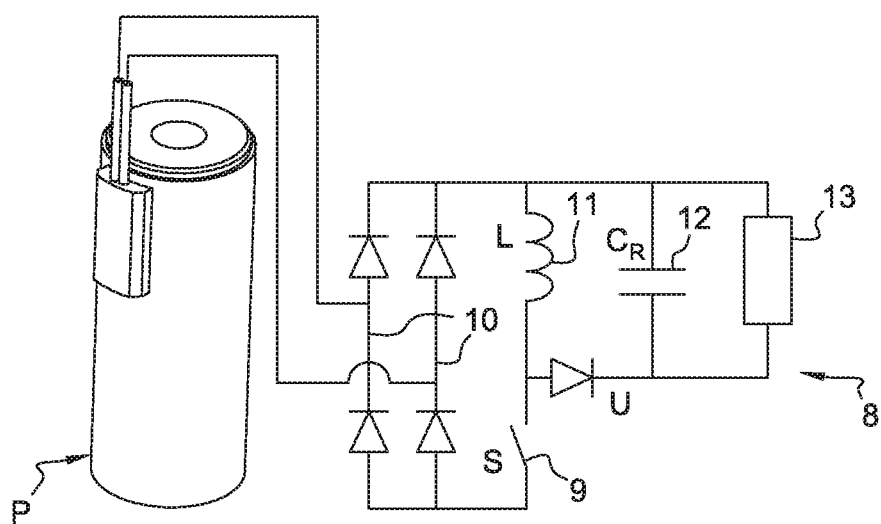
FIG. 5 is a diagrammatical view of the piezoelectric pillar of FIG. 4 combined with a charge extraction circuit.

As shown in FIG. 5, the pillar P is connected to an electronic circuit 8 for extracting charges. This circuit 8 recovers the electrical power produced by the piezoelectric pillar P. It comprises:

a high-voltage control switch 9, advantageously a thyristor, a voltage rectifier bridge 10, an inductance 11 of which the connection with the pillar P constitutes a resonant circuit of the LC type, with the capacitive element being comprised by the pillar itself, a capacitor or a filter capacitor 12 placed in parallel.

a storage system 13 making it possible to store this electrical power before the packaging thereof for usage over the network. This storage system 13 consists for example of a battery or of a bank of super-capacitors. The circuit 8 can be common to each pair of pillars respectively P11-P12 and P21-P22, by being connected simultaneously to each one of the pillars of said pair. A continuous bus can then be charged with collecting the pulses of each one of the storage systems 13.

The configuration of the circuit 8 is suitable for maximising the electrical power produced by the pillar P. This configuration indeed makes it possible to double the electrical power generated by the pillar P by recovering it a first time during the crushing of said pillar, and a second time during the releasing thereof.

When the pillar P is subjected to an alternating excitation (according to the principle described hereinabove in the description), and during the increasing phase of the stress, the switch 9 is kept open. The pillar P is in an open circuit and the electrical charges accumulate at the terminals of said pillar, with the latter operating as a capacitor.

When the mechanical stress applied to the pillar P is maximal, the switch 9 is briefly closed for a duration that corresponds to a half-period of the resonance of the circuit LC. As such, all of the electrical charges accumulated at the terminals of the pillar P are extracted from said pillar.

Durant the decreasing phase of the stress, the pillar P is recharged. When the mechanical stress is minimal, the switch 9 is again briefly closed for a period corresponding to a half-period of the resonance of the circuit LC, in such a way as to extract the electrical charges. Then the cycle resumes.

In order to produce electrical power, it is necessary to apply a mechanical force on the piezoelectric pillars P11, P12, P21, P22. This mechanical force is applied by the actuators A1 and A2.

Figure 6:
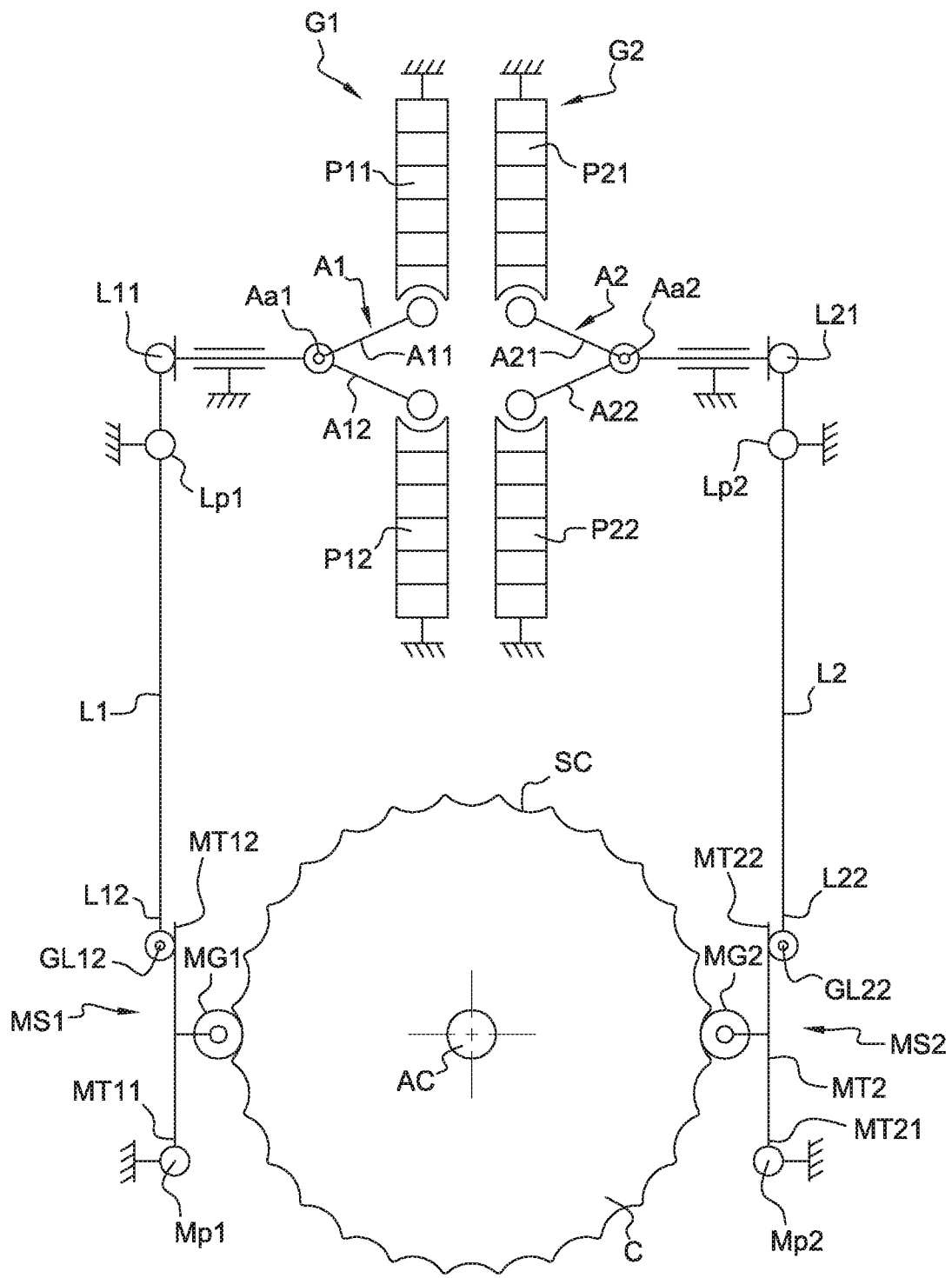
FIG. 6 is a kinematic diagram showing an arrangement of the various elements that comprise a generator assembly in accordance with the invention, FIG. 7 diagrams two generator assemblies in accordance with the invention, said assemblies are combined with a common rotatable wheel.

In the preferred embodiment shown in FIGS. 3 and 6, each actuator, respectively A1 and A2, acts on a pair of pillars, respectively P11-P12 and P21-P22. Each actuator, respectively A1 and A2, has the form of a jaw arranged to simultaneously act on each one of the piezoelectric pillars, respectively P11-P12 and P21-P22, when it is biased by the lever, respectively L1 and L2.

More particularly, each jaw is comprised of two tappets, respectively A11-A12, A21-A22, mounted on a common axis, or articulation, respectively Aa1, Aa2, or two adjacent axes. These tappets, respectively A11, A12, A21 and A22, are bearing against one of the ends of the pillars, respectively P11, P12, P21 and P22, said bearing can be envisaged in the form of a ball-joint connection. Each articulation Aa1, Aa2 is arranged in such a way that a press on said articulation, forces the tappets A11-A12, A21-A22 to separate and press on the end of the pillars with which they are in contact. As the other end of the pillars is integral with a fixed frame, the pillars P11, P12, P21 and P22 are crushed, said crushing generates a deformation of said pillars and the production of electrical power.

In the annexed figures, each generator G1, G2 comprises two pillars, respectively P11-P12 and P21-P22, which are coaxial and arranged in opposition. In this configuration, each tappet A11, A12, A21, A22 exerts on the pillar to which it is attached, a crushing force that is greater than the pushing force applied on the articulations Aa1, Aa2. This amplification in force (by a factor that can vary from 2 to 100) is due to the aperture angle of the tappets A11-A12 and A21-A22 and is similar to the amplification of forces in a deformable parallelogram. The use of this type of jaw between each pair of pillars P11-P12 and P21-P22, furthermore makes it possible to reduce by half the height of pillars P11, P12, P21, P22 and to reduce by half the stresses on the frame.

Each lever, respectively L1, L2, is mounted as a lever arm and engages with the actuator to which it is associated, respectively A1, A2, so as to bias said actuator. In FIG. 6, the levers L1, L2 exert the pushing force on the axes Aa1, Aa2. The term "mounted as a lever arm" means in terms of this invention that each lever L1, L2 is mounted mobile in rotation about a fixed point or a pivot connection Lp1, Lp2. These levers include a first end L11, L21 which engages with the actuator A1, A2 with which said levers are associated, and a second end L21, L22 connected to a follower means MS1, MS2. In order to amplify the pushing force exerted on the axes Aa1, Aa2, the points of rotation Lp1, Lp2 are nearer to the first ends L11, L21 than the second end L12, L22. Each lever L1, L2 preferably has the form of a rigid part made of metal obtained by moulding or machining and of which the length is for example between 10 cm and 100 cm.

The follower means MS1, MS2 are suitable for biasing the levers L1, L2, and having them pivot about their points of rotation Lp1, Lp2, when the cam C is rotated.

In FIGS. 2, 3 and 6, each follower means MS1, MS2 comprises a rod MT1, MT2 suitable for exerting a mechanical force on the lever L1, L2 to which it is connected and which, in response, biases the corresponding actuator A1, A2. The rods MT1, MT2 are each mounted mobile in rotation about a pivot connection Mp1, Mp2 arranged on a first end MT11, MT21. Their second end MT12, MT22 is bearing against the second end L12, L22 of the levers L1, L2. In order to limit friction, the second ends L12, L22 can each be provided with a rotating roller GL12, GL22.

The rods MT1, MT2 preferable each have the form of a rigid part made of metal obtained by moulding or machining and of which the length is for example between 5 cm and 50 cm.

Each rod MT1, MT2 is integral with a roller MG1, MG2 which is mounted rolling on the cam surface MC. These rollers MG1, MG2 are arranged between the two ends of the rods MT1, MT2, in such a way that when the cam C is rotated and the cam surface SC exerts a mechanical force on said roller, the mechanical force exerted by the rods MT1, MT2 on the levers L1, L2 is multiplied.

In practice, when the rollers MG1, MG2 pass over a bump, they separate from the axis of rotation of the cam AC. This separation of the rollers MG1, MG2 causes the rods MT1, MT2 to pivot around their first end MT11, MT12. The levers L1, L2 are then biased on their second end L12, L22, driving their pivoting about points of rotation Lp1, Lp2, said pivoting generates a pushing force on the axes Aa1, Aa2.

This type of follower means has many advantages. Indeed, if H is the height of the bumps, the second end MT12, MT22 of the rods MT1, MT2 is displaced by Y.H with Y≥1 and of which the value depends on the position of the rollers MG1, MG2 on said rods. The freedom of the second end L12, L22 of the levers L1, L2 is also Y×H. By amplifying the freedom of the second ends L12, L22 of the levers L1, L2, the follower means MS1, MS2 as such multiply the pushing forces exerted on the axes Aa1, Aa2, and therefore the mechanical forces exerted on the pillars P11, P12, P21, P22, and in fact the electrical power produced.

The height of the bumps is determined by the crushing force desired on pillars P11, P12, P21, P22. Given that the freedom of the second ends L12, L22 of the levers L1, L2 is amplified, it can be considered to reduce the height of the bumps of the cam surface SC, with respect to the configuration shown in FIG. 1 (where the follower means is a roller 42 directly fixed onto the second end of the lever 43). This decrease in the height of the bumps makes it possible to rotate the cam C faster, and to consequently increase the frequency of biasing of the actuators A1, A2 and therefore that of the pillars P11, P12, P21, P22. As the latter are further biased, the electrical power that they generate also is, which contributes to increasing the output of the system object of the invention.

It can also be considered to increase the height of the bumps of the cam surface SC in order to further amplify the freedom of the second ends L12, L22 of the levers L1, L2 and proportionally increase the mechanical forces exerted on the pillars P11, P12, P21, P22. The size of the latter can as such be increased in order to produce more electrical power.

The number B of bumps present on the cam surface SC participates in the frequency pumping of the excitation of the piezoelectric generators. This number makes it possible to amplify the excitation frequency of pillars P11, P12, P21, P22. Indeed, for each revolution of cam C, each one of the pillars P11, P12, P21, P22 is excited B times. As an example only, a cam surface can be provided having 24 bumps 2 mm high, spaced apart 50 mm for a cam C having a diameter of 40 cm. A cam C is favoured that has an even number of bumps and piezoelectric generators G1, G2 opposite so as to cancel the radial forces generated by the rollers MG1, MG2 on said cam.

In the embodiment shown in the annexed figures, the first subassembly SEG1 and the second subassembly SEG2 are arranged symmetrically with respect to the axis of rotation AC of the cam C. And preferably, the cam surface SC is symmetrical with respect to the axis of rotation AC of the cam C in such a way that the follower means MS1 of the first subassembly SEG1 and the follower means MS2 of the second subassembly SEG2, have analogous, synchronised and diametrically opposite movements. In practice, the two follower means MS1 and MS2 acting over the same diameter of the cam C. When the follower means MS1 passes over a bump (respectively a hollow) of the cam surface SC, the other follower means MS2 also passes over a bump (respectively a hollow). This architecture makes it possible to balance the biasings of the cam C in such a way that the latter is less prone to the vibrations.

Figure 7:
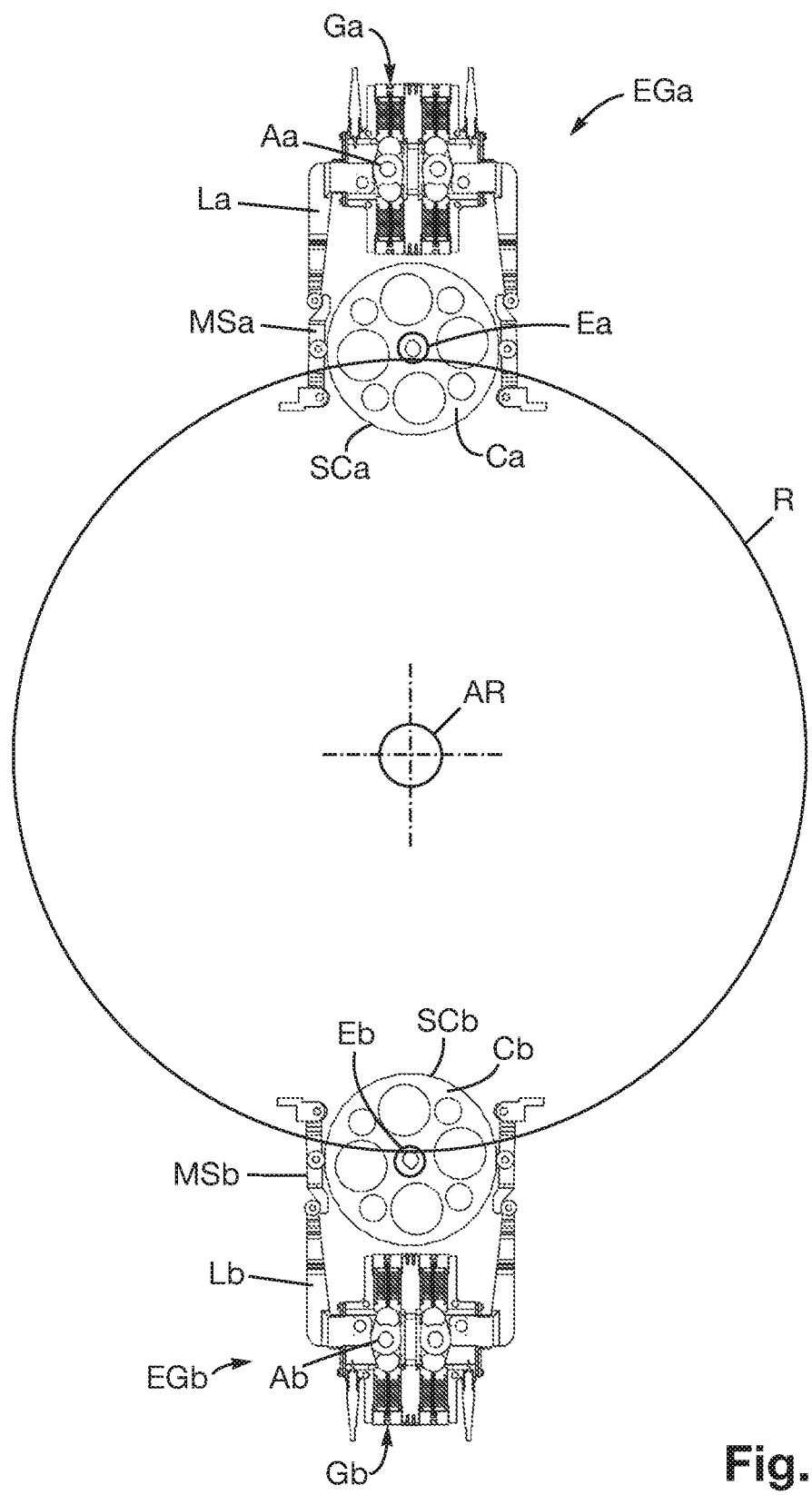

In FIG. 7, two generator assemblies EGa, EGb are shown. Each one of these generator assemblies EGa, EGb is similar to the generator assembly EG which has just been described in reference to FIGS. 2 to 6, i.e. each assembly EGa, EGb comprises at least one piezoelectric generator Ga, Gb to which is associated an actuator Aa, Ab, a rotatable cam Ca, Cb having a cam surface SCa, SCb, a follower means MSa, MSb, a lever La, Lb.

The setting in rotation of the cams Ca and Cb is carried out simultaneously thanks to a common rotatable wheel R. The latter is mounted mobile in rotation about its axis AR. Its diameter is for example between 10 cm and 800 cm. The wheel R can for example comprise a gearing arranged on its periphery, said gearing is engaged with a complementary gearing Ea, Eb integral with the respective axis of rotation of the cams Ca, Cb. The wheel R and the gearings Ea, Eb are sized in such a way that the setting in rotation of said wheel at a rotation speed $W_R$ drives the rotation of the cams Ca, Cb at another rotation speed $W_{Ca}$, $W_{Cb}$ which is greater than that of said wheel.

In practice $W_{Ca}=W_{Cb}=W_R \times Z_R/Z_C$ where:
$Z_R$=number of teeth of the wheel R
$Z_C$=number of teeth of the gearings Ea, Eb
with $Z_R > Z_C$ A power source provides the driving in rotation of the wheel R. This source of power can be a wind turbine or a water turbine of which the axis coincides with the axis AR. The source of power can also be a wave turbine set into rotation by the swell of the sea, or any other suitable drive source for setting into rotation the wheel R (e.g.: heat engine, electric motor, compressed air motor, etc.).

In the case where the source of power is a wind turbine, a water turbine or a wave turbine, the rotation speed to at which the wheel R can be driven is relatively low, for example a few revolutions per minute but with a relatively substantial torque, that can be several hundred even several thousand kN.m. Thanks to the invention, the rotation speed of the cams Ca, Cb is clearly greater, able to reach several hundred revolutions per minute with a torque that is sufficient to stress the piezoelectric generators Ga, Ga at a compounded excitation frequency in relation to the excitation frequency of the wheel R. This state of things contributes to providing a substantial quantity of electrical power, for example several hundred kW, even several Mega W.

Figure 8:
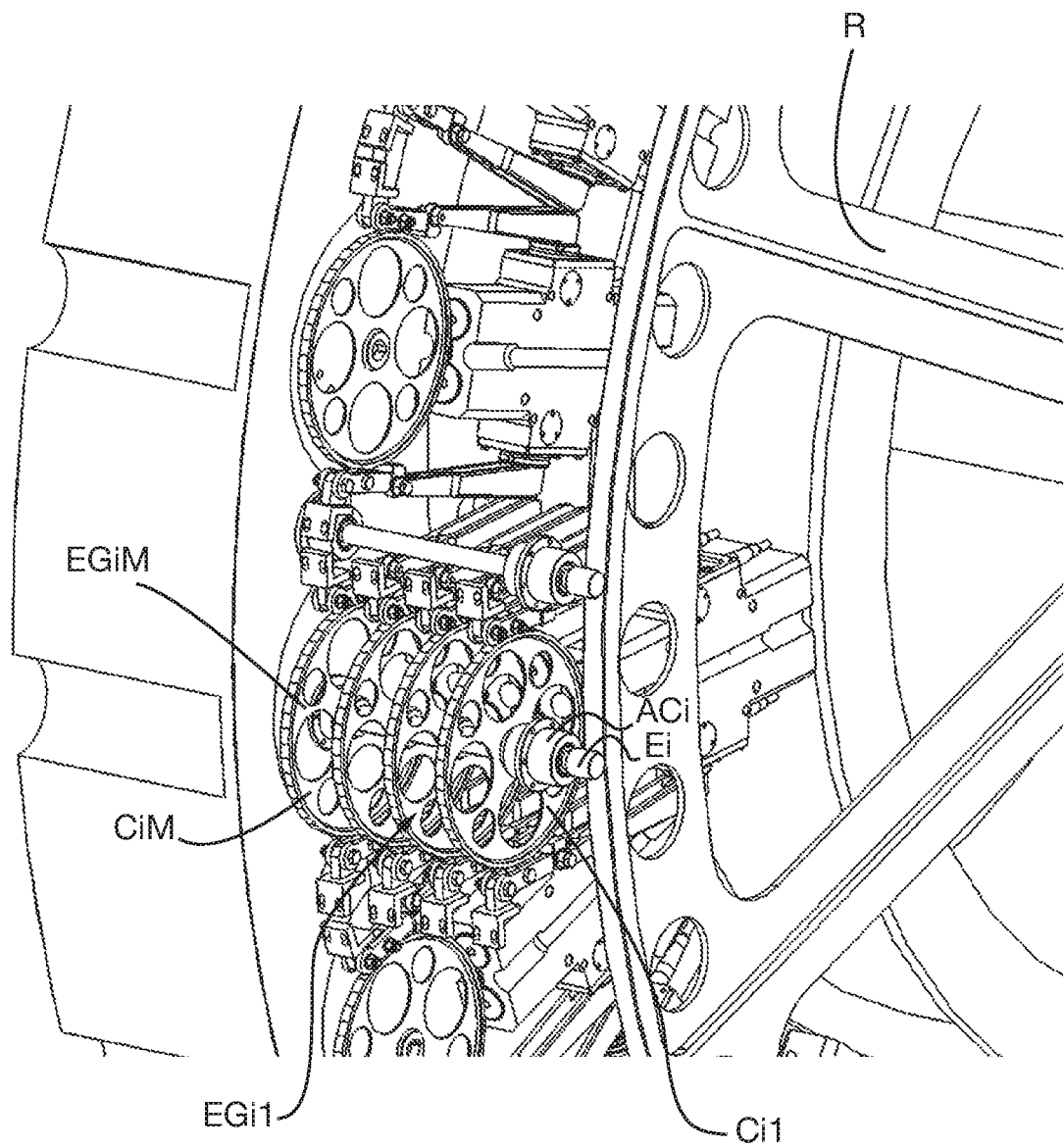
FIG. 8 is an isometric view of the system object of the invention, showing in detail an example of cooperation between the cams and the common rotatable wheel.
Figure 9:
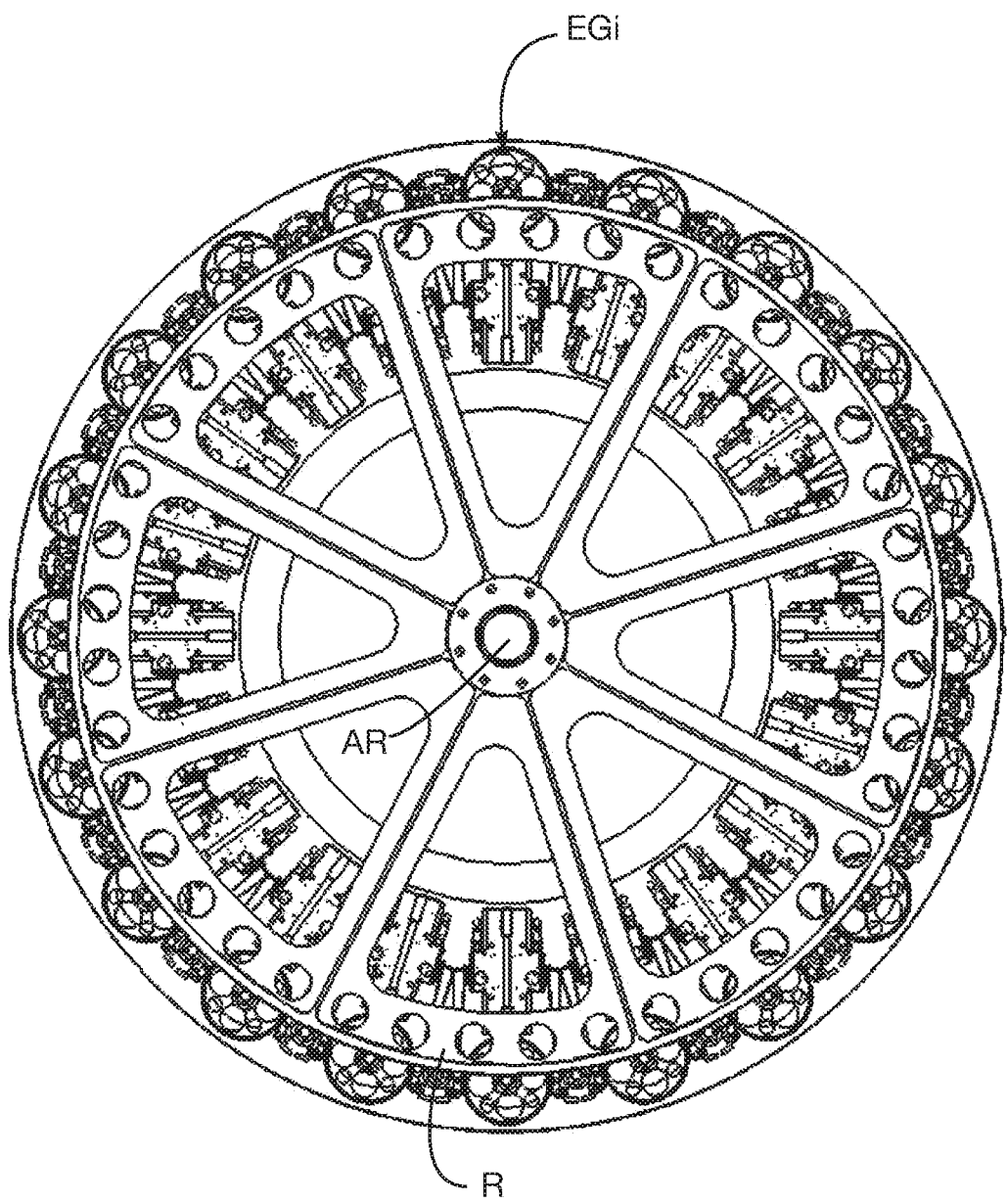
FIG. 9 is a front view of a system object of the invention.
Figure 10:
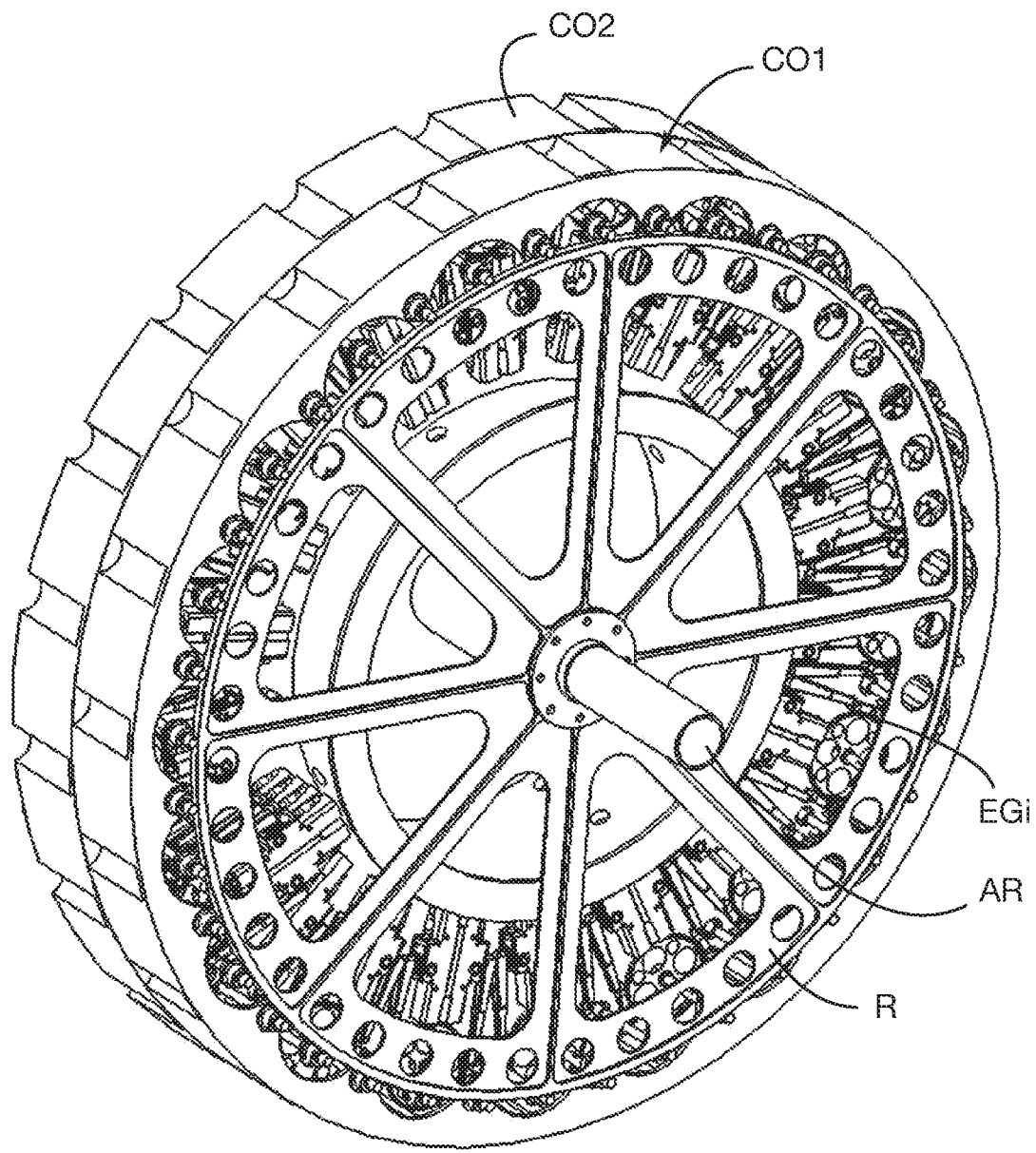
FIG. 10 is an elevational view of the system of FIG. 9.

In FIGS. 8, 9 and 10, the system object of the invention comprises a number N of generator assemblies EGi, where N is an integer greater than or equal to 2. This architecture is based on the principle of an epicyclic gearing, with the N cams playing the role of satellites and the wheel R that of the sun gear. It is therefore sufficient to set into rotation only the wheel R to drive in rotation the N cams and simultaneously stress several piezoelectric generators, which has for effect to multiply the quantity of electrical power produced. In the case where each cam is combined with two piezoelectric generators (case FIGS. 2 to 7), the putting into rotation of the wheel R makes it possible to simultaneously stress 2×N piezoelectric generators.

Using an architecture of the epicyclic gearing type makes it possible to eliminate any gearbox that would allow for the increase in the rotation speed of the cams. In the case of a gearbox, the torque coming from the power sources passes through a single path to arrive at the cams. This is a weak point of wind turbines whereon much damage is observed. Thanks to the architecture of the invention, the torque coming from the power source is divided by the number of cam-satellites, which renders the system much more reliable.

Each one of these generator assemblies EGi is similar to the generator assembly EG described in reference to FIGS. 2 to 6, i.e. it comprises: a piezoelectric generator, an actuator, a rotatable cam having a cam surface, a follower means for following the cam surface, a lever. The wheel R is coupled to the N cams so that the setting of said rotatable wheel in rotation at a rotation speed causes the rotation of the N cams at another rotation speed which is greater than that of said rotatable wheel. The coupling between the wheel R and the N cams is carried out in the same way as described hereinabove in reference to FIG. 7.

In order to homogenise the distribution of the torque on the wheel R and balance the stresses on the latter, the N cams are angularly offset by 2p/N with respect to the axis of rotation AR of the wheel R.

In the embodiment of FIG. 8, a number M of generator assemblies $EGi_1$-$EGi_M$ are stacked axially behind one another, where M is an integer greater than or equal to 2. Each one of these generator assemblies $EGi_1$-$EGi_M$ is similar to the generator assemblies EG, EGa, EGb described hereinabove in reference to FIGS. 2 to 7, i.e. they each include: at least one piezoelectric generator to which is associated an actuator, a rotatable cam $Ci_1$-$Ci_M$ having a cam surface, a follower means, a lever.

The M cams $Ci_1$-$Ci_M$ are mounted in parallel on a common rotating shaft ACi which coincides with their respective axis of rotation. The maintaining in position of the cams $Ci_1$-$Ci_M$ on the shaft ACi is for example, provided by keying. The end of the shaft ACi which is located on the wheel R is provided with a gearing Ei engaged with the complementary gearing arranged on the periphery of said wheel. As such, when the wheel R is set into rotation, its periphery gearing meshes with the gearing Ei, causing the driving in rotation of the shaft ACi and of all of the cams $Ci_1$-$Ci_M$.

Preferably, the cams $Ci_1$-$Ci_M$ have the same cam surface but are angularly offset in relation to one another, with this angular offset being 2p/(M.B), where:
M=integer greater than or equal to 2 (for example between 2 and 20) corresponding to the number of cams $Ci_1$-$Ci_M$ integral with the shaft ACi;
B=number of bumps present on the cam surface of each one of said cams $Ci_1$-$Ci_M$.

This angular offset of the cams $Ci_1$-$Ci_M$ has several advantages. Firstly, it makes it possible to offset the tangential forces applied on the follower means and in particular on their running roller. This tangential force corresponds to the force that the roller must overcome to rise up a bump of the cam surface. This tangential force induces a resistant torque on the shaft ACi. Thanks to the angular offset of the cams $Ci_1$-$Ci_M$, when a roller of a first cam will rise up a bump and create a resistant torque, a roller of another cam will simultaneously go down a bump. The tangential force applied on this other cam, and which results from the lowering of the corresponding roller, induces a motor torque on the shaft ACi which cancels the aforementioned resistant torque. As such, all of the tangential forces induced by "rising" rollers are offset by the tangential forces induced by "lowering" rollers.

In addition, when the piezoelectric pillars are biased by the actuators, their reaction force is primarily constituted of two components: —a so-called "elastic" stiffening force, proportional to the elasticity modulus of the stack of piezoelectric ceramics and electrodes, via Hook's Law; —and a so-called "electric" stiffening force due to the dielectric behaviour of the piezoelectric ceramics. These reaction forces are passed on to the tangential forces applied on the follower means and in particular on their running roller.

Each pair of piezoelectric pillars therefore generates a sinusoidal tangential torque due to its elasticity. By dephasing the cams $Ci_1$-$Ci_M$, and therefore the pairs of generators, the tangential torque resulting from the sum of the sinusoidal tangential torques, is cancelled at the input to the system, i.e. on the axis AR of the wheel R.

The charge extraction (due to the closing of the switches 9 at the tops of the bumps and at the hollows of the cams) generates a tangential torque of the Coulomb type, i.e. of a constant amplitude and with a sign opposite the rotation speed of the cams $Ci_1$-$Ci_M$. These Coulomb torques are added together and generate a constant Coulomb torque on the axis AR of the wheel R. The input of the system, i.e. the axis AR of the wheel R, is therefore subjected only to a Coulomb torque.

If the switches 9 are not actuated, then this Coulomb torque is zero to the nearest friction, but it is not possible to extract electrical power from the system.

If all of the switches 9 are actuated simultaneously, then this Coulomb torque is maximum on the axis AR and opposes the reaction force, which contributes in decreasing the electrical power that can be recovered by the system.

By actuating a portion only of the switches 9 at a given instant, it is possible to adjust the Coulomb torque on the axis AR in order to adjust the reaction torque to a value that allows for optimum recovery of electrical power.

During the closing of the switches 9 (FIG. 5), when the rollers of the follower means reach the top of a bump or the bottom of a hollow, the "electric" stiffening force becomes zero. The reaction force of the pillars concerned is then imbalanced with respect to the reaction forces of the other pillars of which the associated switches remain open. This imbalance is able to impact the tangential forces applied on the cams $Ci_1$-$Ci_M$ and to create a resistant torque, or Coulomb torque, on the shaft ACi. The applicant surprisingly observed that the angular offset of the cams $Ci_1$-$Ci_M$ makes it possible to reduce, and even cancel this Coulomb torque.

When a roller of a follower means is in a cam hollow, and the associated switch 9 is closed for the charge extraction, said roller is in contact with the cam profile and the piezoelectric pillars are relaxed.

When this roller rises to the top of a bump, the piezoelectric pillar is charged and under stress. Its charge is extracted by closing the switch 9. The pillar sees its stress reduced, without the latter being cancelled.

When the roller descends back into the hollow, the piezoelectric pillar is relaxed but charged. The length remains less than the starting length and a detaching of the roller from the cam profile can be observed.

When finally the charge is extracted by closing the switch 9, the piezoelectric pillar suddenly takes back its initial shape and an impact is observed between the roller and the cam profile. Through stress transfer, this impact can damage the elements that comprise the piezoelectric pillar that would be detached, and particularly the ceramics 2 which are of a fragile nature. In order to overcome this, the piezoelectric pillars are pre-stressed so that there is never any detaching, for example at 150 Bars.

Figure 12:
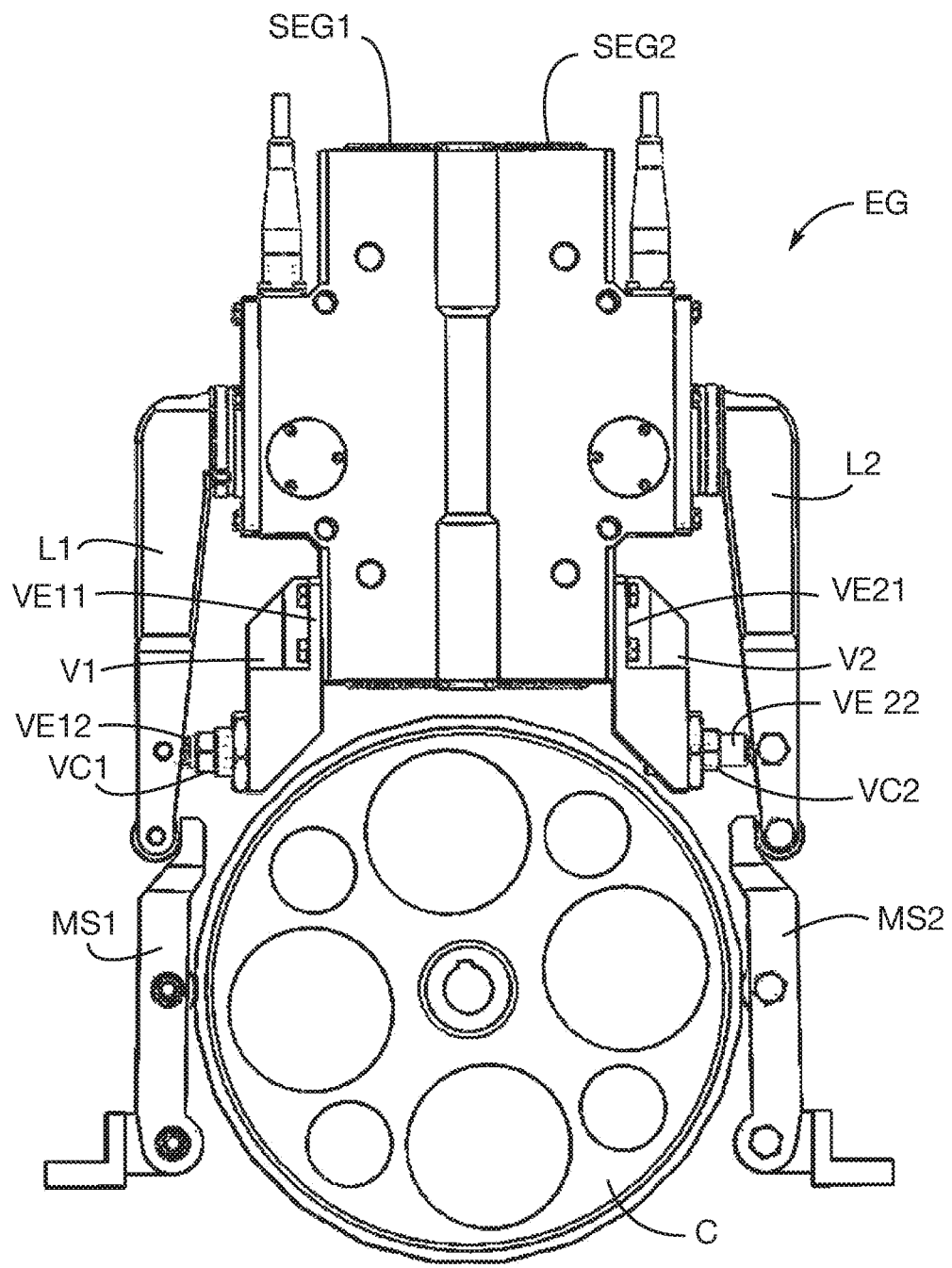
FIG. 12 shows a generator assembly in accordance with the invention, in an alternative embodiment.

In FIG. 12, this pre-stressing is induced by two spring cylinders V1, V2, for example of the Belleville elastic washer type or with flange. These cylinders V1, V2 are installed before the installation of the follower means MS1, MS2. They are placed in the same symmetry as the subassemblies SEG1 and SEG2. The cylinders V1, V2 have an end VE11, VE21 fixed on the frame of the subassemblies SEG1, SEG2, the other end VE12, VE22, forming a stop that pushes the lever L1, L2 at the desired force. This force can be adjusted by the intermediary of a nut VC1, VC2 which compresses/relaxes the spring. By way of example, the pre-stressing applied on the piezoelectric pillars is 150 Bars. At the location where the pre-stressing is applied, the force on the lever L1, L2 is approximately 100 daN for a displacement of said lever of 1.4 mm. The spring has a stroke of 14 mm when the 100 daN are applied to it. This margin makes it possible to prevent any detaching of the stop VE12, VE22 and also to apply a substantial force when the rollers of the follower means MS1, MS2 begin their ascent on a bump of the cam C.

A similar result is obtained by offsetting in the same way, not the M cams $Ci_1$-$Ci_M$, but the follower means for following the cam surface of each generator assembly $EGi_1$-$EGi_M$.

The unit constituted by a rotatable wheel R combined with several cams can be defined as a drive crowns. In FIG. 10, two drive crowns CO1, CO2 are adjoining to one another.

The wheel R of each crown can be integral with a common shaft AR in such a way that the rotation of the latter drives the rotation of said wheels. The quantity of electrical power produced is as such doubled. In this architecture, it is the common shaft AR which is driven in rotation by the external power source.

In an alternative embodiment, a single rotatable wheel R is provided. The two drive crowns CO1, CO2 are placed staggering. The shafts driving the cams of each crown are offset in such a way as to mesh on the common rotatable wheel R, which doubles the number of cam-satellites associated with said wheel.

Figure 11:
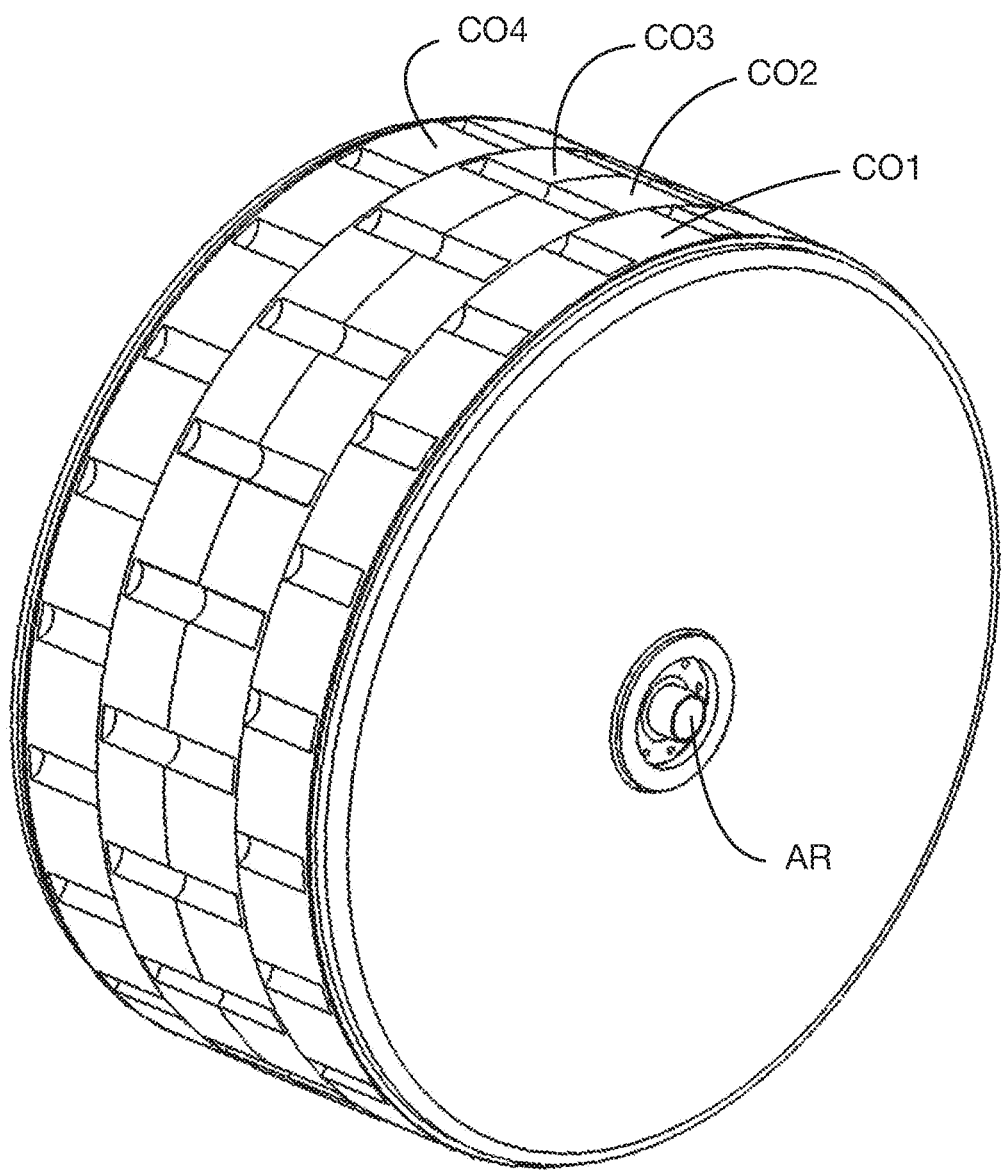
FIG. 11 shows the system of FIG. 10 closed by a carter.

In FIG. 11, four drive crowns CO1, CO2, CO3, CO4 are juxtaposed, side-by-side. The unit is protected and insulated by a fairing. Each pair of drive crowns CO1-CO2 and CO3-CO4 is associated with its own rotatable wheel R. These two rotatable wheels are integral with a common shaft AR in such a way that the rotation of the latter drives the rotation of said wheels.

Figure 1:
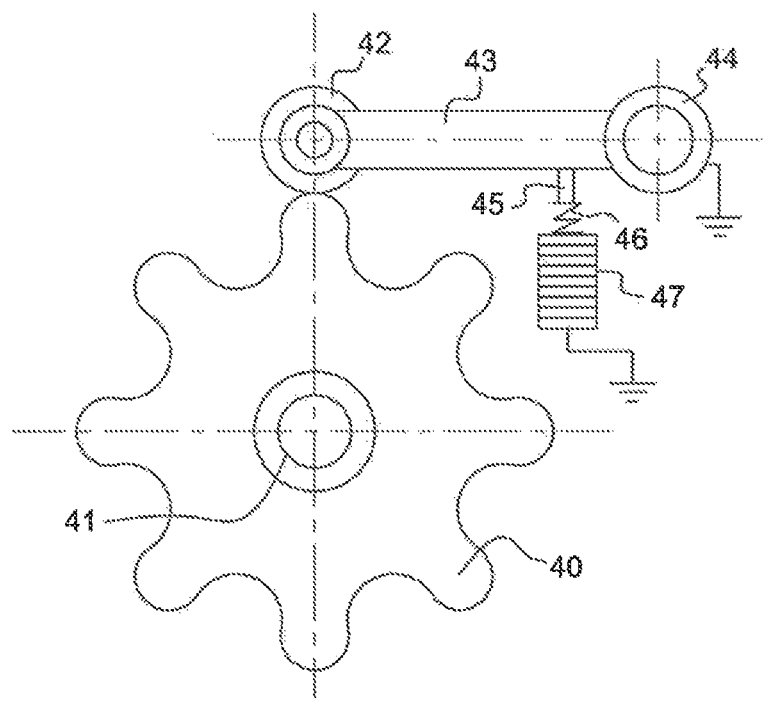
FIG. 1 mentioned hereinabove reproduces an embodiment of a generator system shown in patent document U.S. Pat. No. 7,005,779 (ERICKSON)

The arrangement of the various elements and/or means and/or steps of the invention, in the embodiments described hereinabove, must not be understood as requiring such an arrangement in all of the implementations. In any case, it shall be understood that various modifications can be made to these elements and/or means and/or steps. In particular:

the number of generator assemblies and/or their design and/or size, can vary according to the energy output desired for the system;

the cam surface SC can have a sinusoidal profile, but with a flat at the top of the bumps and at the bottom of the hollows, with this profile making it possible to optimise the extraction of the electrical charges accumulated at the terminals of the pillar P, the generator assembly EG can comprise a single subassembly SEG1 or SEG2 engaged with the cam C, the generator assembly EG can on the contrary comprise more than two subassemblies distributed homogeneously around the cam C (for example a number X of subassemblies offset by 2p/X, where X is an integer greater than 2, in particular between 2 and 20); a configuration can be considered that makes it possible to distribute the force in such a way that it is not applied on all of the follower means at the same time: for a given time, certain follower means are displaced on bumps while others are displaced in the hollows; for this, the cam comprises preferably aX+1 bumps, the parameter a being an integer, preferably equal to 2, chosen so that the number of bumps is greater than the number of follower means; with such a number of bumps, the tangential forces exerted by the follower means on the cam are offset in order to reduce the resulting total tangential force; a different number of bumps can however be considered: it is for example possible to consider a number of bumps equal to a multiple of the number of follower means with, in this particular case, a resulting tangential force which is equal to the sum of the tangential forces of the follower means;

the generator assembly EG can comprise an odd number of equally-distributed subassemblies around the cam C, the generator assemblies EG, Ega, EGb, EG1 can be located outside the perimeter of the rotatable wheel R (FIGS. 7 to 10), or inside this perimeter, each piezoelectric generator G1, G2 can comprise a single piezoelectric pillar, or on the contrary several other piezoelectric pillars of which the number can for example be between 3 and 40;

the ceramics 2 and the electrodes 3 can have a square, rectangular, oval, etc. section; these elements 2, 3 can also have other arrangements equivalent to their axial drilling in order to ensure their alignment;

each pillar P11, P12, P21, P22 can be stressed by its own actuator;

the actuators A1, A2 are not necessarily constituted of jaws, but can have other forms, in particular in the form of a spring similar to the spring 46 diagrammed in FIG. 1;

The first ends L11, L21 of the levers L1, L2 can directly act on the piezoelectric pillars and play the role of an actuator;

the roller GL12, GL22 can constitute the follower means, in which case this roller is directly mounted rolling on the cam surface SC; such a configuration corresponds to that diagrammed in FIG. 1;

The bumps of the cam surface SC as well as the follower means MS1, MS2 can be replaced by magnets in such a way as to bias without contact the levers L1, L2.

the putting into rotation of the cam C could directly be provided by the external power source, by avoiding the use of the rotatable wheel R; such a configuration corresponds to that diagrammed in FIG. 1;

A chain or a belt can provide the coupling between the rotatable wheel R and the cams Ca, Cb.

The invention claimed is:

1. System A system for producing electrical power including at least one first generator assembly comprising:
at least one first piezoelectric generator suitable for generating electrical power in response to a mechanical force applied onto the at least one first piezoelectric generator,
a first actuator suitable for applying a mechanical force onto the at least one first piezoelectric generator when the first actuator is biased,
a first rotatable cam having a first cam surface,
a first follower means for following the first cam surface, and
a first lever connected to the first follower means, the first lever is mounted as a first lever arm and engages with the first actuator so as to bias the first actuator when the first rotatable cam is rotated and the first cam surface exerts a mechanical force on the first follower means;
the system further includes at least one second generator assembly comprising:
at least one second piezoelectric generator suitable for generating electrical power in response to a mechanical force applied to the at least one second piezoelectric generator,
a second actuator suitable for applying a mechanical force onto the at least one second piezoelectric generator when the second actuator is biased,
a second rotatable cam having a second cam surface,
a second follower means for following the second cam surface,
a second lever connected to the second follower means, the second lever is mounted as a second lever arm and engages with the second actuator so as to bias the second actuator when the second rotatable cam is rotated and the second cam surface exerts a mechanical force on the second follower means; and
the system further includes a rotatable wheel which is rotated by a power source, the rotatable wheel is coupled to the first rotatable cam and to the second rotatable cam so that a setting of the rotatable wheel in rotation at a first rotation speed causes the rotation of the first and second rotatable cams at another rotation speed which is greater than the first rotation speed.

2. The system according to claim 1, further comprising an integer N≥2 of generator assemblies with each generator assembly comprising:
at least one Nth piezoelectric generator suitable for generating electrical power in response to a mechanical force applied onto the at least one Nth piezoelectric generator,
an Nth actuator suitable for applying a mechanical force onto the at least one Nth piezoelectric generator when the Nth actuator is biased,
an Nth rotatable cam having an Nth cam surface,
an Nth follower means for following the Nth cam surface,
an Nth lever connected to the Nth follower means, the Nth lever is mounted as an Nth lever arm and engages with the Nth actuator so as to bias the Nth actuator when the Nth rotatable cam is rotated and the Nth cam surface exerts a mechanical force on saidthe Nth follower means,
and wherein the rotatable wheel is coupled to the N rotatable cams so that a setting of the rotatable wheel in rotation at the first rotation speed causes the N rotatable cams to rotate at another rotation speed which is greater than the first rotation speed.

3. The system according to claim 2, wherein the N rotatable cams are angularly offset by 2p/N with respect to an axis of rotation of the rotatable wheel.

4. The system according to claim 1, wherein:
each generator assembly is associated with a rotatable cam having a cam surface, wherein each generator assembly comprises:
a first subassembly comprising: a piezoelectric generator, an actuator, a follower means for following the cam surface, a lever,
a second subassembly comprising: another piezoelectric generator, another actuator, another follower means for following the cam surface, another lever,
the first subassembly and the second subassembly are arranged symmetrically with respect to an axis of rotation of the rotatable cam.

5. The system according to claim 4, wherein the cam surface is symmetrical with respect to the axis of rotation of the rotatable cam in such a way that the follower means for following the rotatable cam of the first subassembly and the follower means for following the rotatable cam of the second subassembly have analogous and synchronized movements.

6. The system according to claim 1, wherein each piezoelectric generator is configured as two piezoelectric pillars each formed by alternating piezoelectric ceramics and electrodes stacked axially, with the two piezoelectric pillars being coaxial and arranged in opposition to one another.

7. The system according to claim 6, wherein the first actuator or the second actuator is formed as a jaw arranged to simultaneously act on each of the corresponding piezoelectric pillars when biased by the respective first lever or second lever.

8. The system according to claim 1, comprising an integer M≥2 of generator assemblies with each generator assembly comprising:
    at least one Mth piezoelectric generator suitable for generating electrical power in response to a mechanical force applied onto the at least one Mth piezoelectric generator,
    an Mth actuator suitable for applying a mechanical force onto the at least one Mth piezoelectric generator when the Mth actuator is biased,
    an Mth rotatable cam having an Mth cam surface,
    an Mth follower means for following the Mth cam surface,
    an Mth lever connected to the Mth follower means, the Mth lever is mounted as an Mth lever arm and engages with the Mth actuator so as to bias the Mth actuator when the Mth rotatable cam is rotated and the Mth cam surface exerts a mechanical force on the Mth follower means, and wherein the M rotatable cams are mounted in parallel on a common rotating shaft, the rotatable wheel is engaged with the common rotating shaft in such a way that the setting into rotation of the common rotating shaft causes a simultaneous setting into rotation of the M rotatable cams.

9. The system according to claim 8, wherein:
    the M rotatable cams have the same cam surface, said cam surface is comprised of a regular alternation of hollows and bumps,
    the M rotatable cams are angularly offset on the common rotating shaft, by an angular offset of 2p/(M.B), where B corresponds to a number of bumps present on the cam surface of each one of the M rotatable cams.

10. The system according to claim 8, wherein:
    the M rotatable cams have the same cam surface, said cam surface is comprised of a regular alternation of hollows and bumps,
    the follower means for following the cam surface of each generator assembly are angularly offset on the common rotating shaft by an angular offset of 2p/(M.B), where B corresponds to a number of bumps present on the cam surface of each one of the rotatable cams.

11. The system according to claim 1, wherein each of the first and the second follower means comprises:
    a rod suitable for exerting a mechanical force on the respective first or second lever to which the respective first or second follower means is connected, the respective first or second lever, in response to the mechanical force, biases the corresponding first or second actuator,
    a roller, integral with the rod, mounted rolling on the respective first or second cam surface, the roller is arranged in such a way that when the respective first or second rotatable cam is rotated and the respective first or second cam surface exerts a mechanical force on said roller, the mechanical force exerted by the rod on the respective first or second lever is multiplied.

12. A device for applying a mechanical force on a piezoelectric generator in order to generate electrical power, said device comprising:
    an actuator suitable for applying a mechanical force onto the piezoelectric generator when the actuator is biased,
    a rotatable cam having a cam surface,
    a follower means for following the cam surface,
    a lever connected to the follower means, the lever is mounted as a lever arm and engages with the actuator so as to bias the actuator when the rotatable cam is rotated and the cam surface exerts a mechanical force on the follower means, and
    a rotatable wheel suitable for being driven in rotation by a power source, the rotatable wheel is coupled with the rotatable cam, so that a setting of the rotatable wheel in rotation at a first rotation speed causes the rotatable cam to rotate at another rotation speed which is greater than the first rotation speed.

13. A method for applying a mechanical force onto a piezoelectric generator in order to generate electrical power, said method comprising:
    installing an actuator suitable for applying a mechanical force onto the piezoelectric generator when the actuator is biased,
    installing a rotatable cam having a cam surface,
    installing a follower means for following the cam surface,
    mounting a lever as a lever arm,
    connecting the lever to the follower means, and having the lever engage with the actuator in such a way that said lever is able to bias the actuator and that, in response to this biasing, the actuator applies a mechanical force onto the piezoelectric generator,
    driving the rotatable cam in rotation in such a way that the cam surface exerts a mechanical force on the follower means and the lever biases the actuator, and
    coupling the rotatable cam with a rotatable wheel, so that a setting of the rotatable wheel in rotation at a first rotation speed causes the rotatable cam to rotate at another rotation speed which is greater than the first rotation speed.

* * * * *